United States Patent
Top et al.

(10) Patent No.: US 8,474,696 B2
(45) Date of Patent: Jul. 2, 2013

(54) PAYMENT TERMINAL ESD TEST

(75) Inventors: Mustafa Top, Foster City, CA (US);
Stanley Weitz, Glenside, PA (US)

(73) Assignee: Visa International Service Association, San Francisco, CA (US)

( * ) Notice: Subject to any disclaimer, the term of this patent is extended or adjusted under 35 U.S.C. 154(b) by 74 days.

(21) Appl. No.: 13/095,702

(22) Filed: Apr. 27, 2011

(65) Prior Publication Data

US 2011/0284629 A1 Nov. 24, 2011

Related U.S. Application Data

(60) Provisional application No. 61/329,506, filed on Apr. 29, 2010.

(51) Int. Cl.
*G07F 19/00* (2006.01)
(52) U.S. Cl.
USPC ............................. 235/379; 235/438

(58) Field of Classification Search
USPC .................. 235/379, 438; 324/457
See application file for complete search history.

(56) References Cited

U.S. PATENT DOCUMENTS

| 4,742,427 A | 5/1988 | Richman | |
|---|---|---|---|
| 2008/0174315 A1* | 7/2008 | Top et al. | 324/457 |
| 2010/0065637 A1* | 3/2010 | Top et al. | 235/438 |

* cited by examiner

*Primary Examiner* — Kristy A Haupt
(74) *Attorney, Agent, or Firm* — Kilpatrick Townsend & Stockton

(57) ABSTRACT

Systems and methods for performing test procedures for measuring and defining the sensitivity of payment terminals to ESD (electrostatic discharge) are disclosed. In some embodiments, a plurality of test equipment in a controlled environment are used to measure the peak discharge current (Ip) when a payment device is inserted into a payment terminal during several simulated conditions. Energy levels of the discharge currents are calculated using an energy calculation program. One or more reference current and energy levels are determined.

32 Claims, 9 Drawing Sheets

| Payment Terminal # and Payment Device # | Current Ip (mA) measurement during insertion following: First Test Procedure and Second Test Procedure | | |
|---|---|---|---|
| | First Test Procedure Normal | Second Test Procedure Walking (3 Steps) | |
| | | Walking on Tile | Walking on Carpet |
| Payment Terminal 1 | | | |
| Payment Device 1 | Too low | 2700 | - |
| Payment Device 2 | Too low | 1400 | - |
| Payment Device 3 | 75 | 1550 | - |
| Payment Device 4 | 290 | 3800 | - |
| Payment Device 5 | Too Low | 7200 | - |
| Payment Terminal 2 | | | |
| Payment Device 1 | Too low | 1250 | -390 |
| Payment Device 2 | 210 | 1570 | -485 |
| Payment Device 3 | 85 | 1290 | -550 |
| Payment Device 4 | 140 | 2450 | -2105 |
| Payment Device 5 | Too Low | 1220 | -2010 |
| Payment Terminal 3 | | | |
| Payment Device 1 | 75 | 1720 | -1410 |
| Payment Device 2 | Too low | 1910 | -1280 |
| Payment Device 3 | 95 | 1685 | -1590 |
| Payment Device 4 | 320 | 2110 | -1770 |
| Payment Device 5 | Too low | 1750 | -1950 |
| Payment Terminal 4 | | | |
| Payment Device 1 | - | - | - |
| Payment Device 2 | - | - | - |
| Payment Device 3 | - | - | - |
| Payment Device 4 | - | - | - |
| Payment Device 5 | - | - | - |

-: No data available
Bold Face Type: Terminal Failure

*FIG. 6*

| Payment Terminal # and Payment Device # | Energy (nJ) measurement during insertion following: First Test Procedure and Second Test Procedure C | | |
|---|---|---|---|
| | First Test Procedure | Second Test Procedure | |
| | | Walking on Tile | Walking on Carpet |
| Payment Terminal 1 | | | |
| Payment Device 1 | 3.7 | 1750 | - |
| Payment Device 2 | 1.2 | 420 | - |
| Payment Device 3 | 2.2 | 175 | - |
| Payment Device 4 | - | - | - |
| Payment Device 5 | - | 69980 | - |
| Payment Terminal 2 | | | |
| Payment Device 1 | 0.72 | - | 270 |
| Payment Device 2 | 10.2 | 780 | 490 |
| Payment Device 3 | 5.3 | 1105 | 120 |
| Payment Device 4 | 72 | 3750 | - |
| Payment Device 5 | - | 4200 | 1395 |
| Payment Terminal 3 | | | |
| Payment Device 1 | 7.5 | 6205 | 420 |
| Payment Device 2 | 5.2 | 1175 | 810 |
| Payment Device 3 | 1.3 | 295 | 950 |
| Payment Device 4 | 5.5 | 1825 | - |
| Payment Device 5 | - | 2250 | - |
| Payment Terminal 4 | | | |
| Payment Device 1 | - | - | - |
| Payment Device 2 | - | - | - |
| Payment Device 3 | - | - | - |
| Payment Device 4 | - | - | - |
| Payment Device 5 | - | - | - |

-: No data available
Bold Face Type: Terminal Failure

*FIG. 7*

| | Energy (nJ) and Current (mA) measurements. Defining the Threshold Voltage (kV) (on the payment device) starting to cause terminal disturbance. (Threshold charge voltage on the payment device defines the susceptibility level of the payment terminal when the interruption starts to occur) Third Test Procedure | | | | | | | |
|---|---|---|---|---|---|---|---|---|
| | Payment Terminal #1 | Payment Terminal #2 | Payment Terminal #3 | Payment Terminal #4 | Payment Terminal #1 | Payment Terminal #2 | Payment Terminal #3 | Payment Terminal #4 |
| | Very Low Immunity | Low Immunity | Moderate Immunity | High Immunity | Very Low Immunity | Low Immunity | Moderate Immunity | High Immunity |
| Threshold Card Charge Values →→→ | 0.25 – 0.30 kV | 1.5 – 2.0 kV | 5.0 kV | 10.0 kV | 0.25 – 0.30 kV | 1.5 – 2.0 kV | 5.0 kV | 10.0 kV |
| | Measured Current Ip (mA) ↓ ↓ ↓ | | | | Measured Energy (nJ) ↓ ↓ ↓ | | | |
| Payment Device 1 | 825 | | | | 175 | | | |
| Payment Device 2 | 875 | | | | 125 | | | |
| Payment Device 3 | 995 | | | | 220 | | | |
| Payment Device 4 | 1005 | | | | 510 | | | |
| Payment Device 5 | Too low | | | | 25085 | | | |
| Payment Device 1 | | -1715 | | | | - | | |
| Payment Device 2 | | -1125 | | | | - | | |
| Payment Device 3 | | -695 | | | | 625 | | |
| Payment Device 4 | | -1250 | | | | - | | |
| Payment Device 5 | | -2015 | | | | 185 | | |
| Payment Device 1 | | | 2480 | | | | 5200 | |
| Payment Device 2 | | | 2790 | | | | 5520 | |
| Payment Device 3 | | | | | | | 15825 | |
| Payment Device 4 | | | 4200 | | | | 9975 | |
| Payment Device 5 | | | -6985 | | | | 11286 | |
| Payment Device 1 | | | | 825 | | | | 318 |
| Payment Device 2 | | | | 895 | | | | 213 |
| Payment Device 3 | | | | 723 | | | | 202 |
| Payment Device 4 | | | | 1347 | | | | 295 |
| Payment Device 5 | | | | 1028 | | | | 375 |

-: No data available
Bold Face Type: Terminal Failure

*FIG. 8*

PAYMENT TERMINAL ESD TEST

CROSS-REFERENCES TO RELATED APPLICATIONS

The present application is a non-provisional of and claims the benefit under 35 U.S.C. §119(e) of the U.S. Provisional Patent Application No. 61/329,506, entitled "Payment Terminal ESD Test," filed on Apr. 29, 2010, the entire disclosure of which is incorporated herein by reference for all purposes.

BACKGROUND

ESD (Electrostatic Discharge) relates to sudden and momentary electric current that flows between two objects at different electrical potentials and is caused by direct contact or is induced by an electrostatic field. ESD sometimes occurs as a result of a built up charge on a person or object. When the person or object comes in close proximity to a different electrical potential, a discharge occurs. The discharge produces a current pulse with a very fast rise time.

ESD at certain levels has the capability of damaging some electronic equipment. In particular, it is known that ESD may cause a temporary interruption or permanent damage to Point of Sale (POS) payment terminals used in payment transactions. Recently, the addition of more metal-based components or secure elements in or on payment devices (also referred to as reference cards or test cards) such as debit or credit cards, has increased the risk of an ESD event that may be sufficient enough to disturb the payment transaction.

There are test procedures and protocols in place to identify the ESD risk on payment cards such as debit or credit cards. However there is no standard test procedure for Point of Sale (POS) payment terminals to define their ESD resistance levels. Therefore, a need for a solution as guidelines and testing methods for testing the payment terminals has been raised. Embodiments of the invention address these and other problems, individually and collectively.

BRIEF SUMMARY

Systems and methods for performing test procedures for measuring and defining ESD resistance of payment terminals are disclosed.

One embodiment of the invention is directed to the use of a plurality of test equipment and test systems in a controlled environment to measure a peak discharge current (Ip) when a payment device is inserted into a payment terminal during several simulated conditions.

Another embodiment of the invention is directed to measuring a capacitance of a payment device using a capacitance measure fixture and a capacitance meter, measuring a first current level after performing a first test procedure, measuring a second current level after performing a second test procedure, and measuring a third current level after performing a third test procedure. The current levels are measured using a current transducer and an oscilloscope or other measuring devices.

Another embodiment of the invention is directed to a payment terminal and an oscilloscope connected to the payment terminal. The current transducer measures a current when a payment device is inserted into the payment terminal.

Further details regarding embodiments of the invention are provided below in the Detailed Description and Claims.

BRIEF DESCRIPTION OF THE DRAWINGS

FIG. 6 illustrates a table with sample measurements from a test procedure, according to an embodiment of an invention.

FIG. 7 illustrates a table with sample measurements from a test procedure, according to an embodiment of an invention.

FIG. 8 illustrates a table with sample measurements from a test procedure, according to an embodiment of an invention.

DETAILED DESCRIPTION

Figure 1:
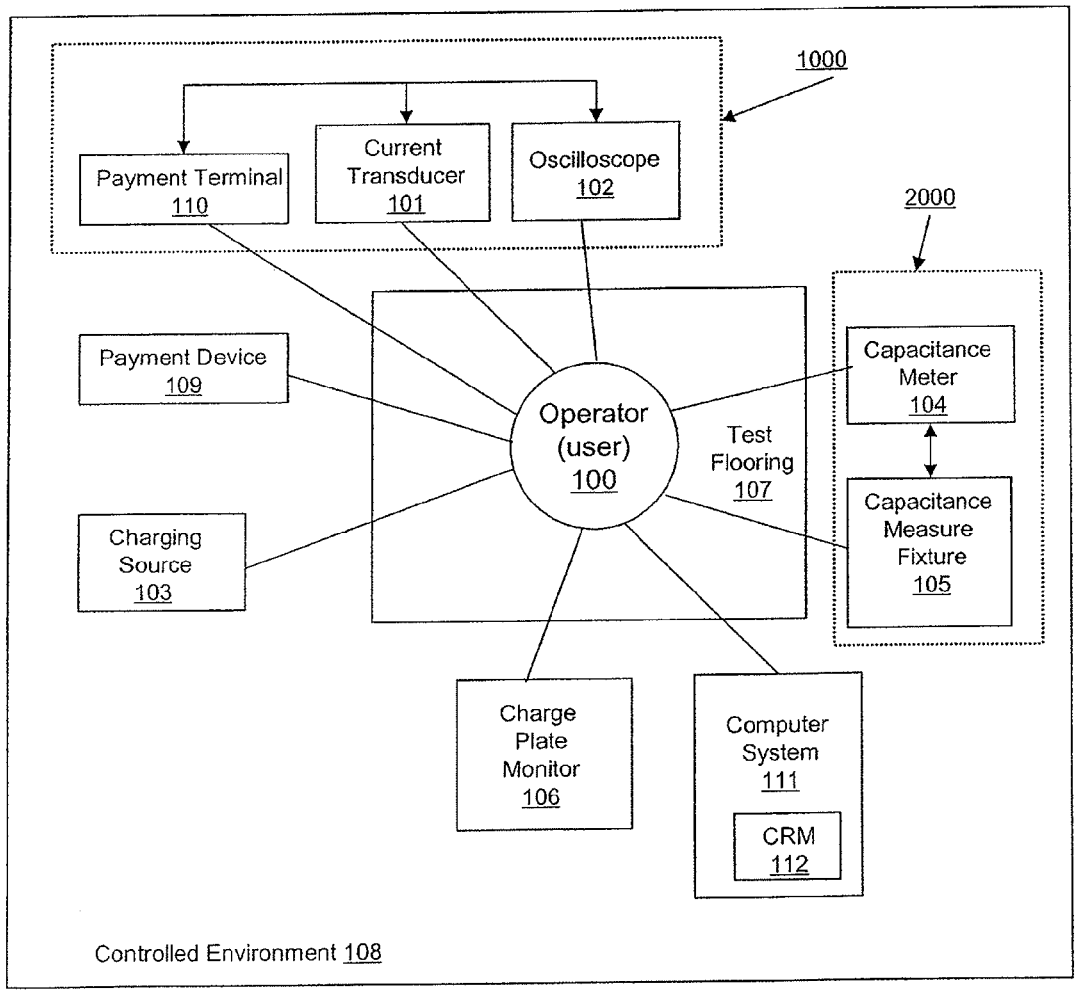
FIG. 1 illustrates the test equipment involved in the test procedures, according to an embodiment of the invention.

Embodiments of the invention disclosed herein include systems and methods for performing test procedure to define ESD susceptibility levels of payment terminals used to perform electronic payment transactions.

Embodiments of the invention allow the designers of payment terminals to determine the current and energy levels that will cause interruption in a payment transaction or temporary/permanent damage to the payment terminals.

In some embodiments, test methods for measuring the electrostatic discharge sensitivity of payment terminals used for point of sale transactions and access devices are disclosed. In some embodiments, test methods evaluate the payment terminals in a manner that replicates their use in the field by simulating a person that becomes charged through certain activities and inserts a payment device into a payment terminal.

In some embodiments, the test method relies on the measurement of the peak discharge current (Ip) generated and its corresponding discharge energy when a payment device is charged to specific voltage levels and then inserted into a payment terminal.

In the embodiments of the invention, two preparation steps are performed prior to a series of test procedures. The first preparation step is performed by placing the payment device, the payment terminal and the test equipment, that are going to be used in the tests, in a control environment. The controlled environment conditions the Payment device and test equipment by maintaining a relative humidity and temperature that simulates the operating conditions in the field.

The second preparation step is performed by measuring the capacitance of the components of a payment device using a capacitance measure fixture and a capacitance meter. Capacitance is a measure of the amount of charge that can be stored in a given component on the payment device. This preparation step indicates whether the payment device is capable of retaining enough charge to produce an electrostatic discharge of certain levels as needed by the test procedures. In some embodiments, the capacitance of the each of the components of the payment device should be at least 5 pF. In some embodiments, the capacitance of the magnetic stripe of the payment device should be less than or equal to 2 pF. In these embodiments, if the capacitance of a component of the payment device is less than 5 pF, or the capacitance of the magnetic stripe is more than 2 pF, then another payment device is used for the test procedures.

After the preparation steps, a first test procedure is performed. This first test procedure is comprised of normal insertion of the payment device into a payment terminal. Alternatively, the payment device may otherwise be placed in close proximity to the payment terminal. This test simulates normal operating conditions of a payment terminal. Also in this test, a first current level is measured and a first energy level is calculated. Measuring the first current level is performed by using a current transducer and an oscilloscope, and the first energy level calculation is performed by a computer system running an energy calculation program.

In a second test procedure, a second current level is measured by an operator performing a pre-defined physical activity to cause a build up of electrostatic charge on the payment device, and then inserting the payment device into the payment terminal. In this test, an operator (user) can wear a particular type of footwear (e.g., sneakers) and can perform a pre-defined physical activity (e.g., operator walks across a test floor) to charge the payment device. The goal of this test is to simulate a build up of charge on the payment device through user activity such as walking up to a payment terminal while holding the payment device.

As in the first test procedure, the second current level is also measured via a current transducer and an oscilloscope. Also, in the second test procedure a second energy level is calculated by using the energy calculation program used in the first test procedure.

In the third test procedure, a series of steps are performed to determine a minimum charge on a payment device that causes a payment terminal disruption, when the payment device contacts the read head of the payment terminal. These steps are charging the payment device to 2.5 KV via a charging source, inserting the payment device into the payment terminal, observing the payment terminal for proper operation, and incrementing an output of the charging source by 500 V, when the payment terminal continues to operate properly.

In some situations, the 2.5 KV charge on the payment device may cause the payment terminal to malfunction. If this occurs, the charge on the payment device needs to be gradually reduced until the payment terminal operates properly. This is done by decrementing an output of the charging source by 250 V, and repeating the charging, inserting, observing, and decrementing steps until the payment terminal starts functioning properly. At this point, the current level prior to the voltage level that results in proper function of the device is recorded as the third current level.

In some embodiments, the third test procedure is performed by starting with a negative voltage level (i.e. −2.5 KV). In one embodiment, the payment device is charged to −2.5 KV and the absolute value of this voltage is incremented by 500 V until the payment device stops functioning properly. In another embodiment, if the −2.5 KV charge of the payment device causes the payment terminal to malfunction, then the absolute value of this voltage is gradually decremented by 250V until the payment terminal starts to function properly.

The above steps are repeated until the payment terminal stops functioning properly. At this point, a third current level is measured and a third energy level is calculated. As in the previous test procedures, the current level is measured via a current transducer and an oscilloscope or other measuring device and the energy level is calculated via the energy calculation program.

In some embodiments, the payment terminal may continue to operate properly until a voltage of ±10 kV has been reached. If a payment terminal continues to function properly when the payment device is charged up to ±10kV, then that payment terminal will most likely withstand a majority of the ESD events in the filed.

In some embodiments, a reference current level equal to or greater than the highest of the first current level, the second current level and the third current level is determined at the conclusion of the test procedures. This reference current level becomes the actual reference threshold level that the payment terminal can withstand without a malfunction or interruption. Also, a corresponding energy level for each of the first, second and third current level is calculated and a reference energy level equal to or greater than the highest of the first energy level, the second energy level and the energy current level is determined.

In some embodiments, the test procedures may be used to measure the first, the second and the third current and energy levels of a payment terminal, and compare them to pre-defined reference current and energy levels. In these embodiments, the test procedures may be used to determine whether a payment terminal can withstand electrostatic discharge of certain levels.

It will be understood by those skilled in the art that even though the test procedures are referred to as the first, the second and the third test procedure, they may be performed in any order.

The systems, test equipment, test preparation methods and test procedures will now be described in detail with reference to the figures.

I. Systems

FIG. 1 shows the test equipment involved in the test procedure according to an embodiment of the invention. FIG. 1 shows operator 100, current transducer 101, oscilloscope 102, charging source 103, capacitance meter 104, capacitance measure fixture 105, charge plate monitor 106, test flooring 107, controlled environment 108, payment device 109, payment terminal 110, computer system 111, and computer readable medium (CRM) 112. In some embodiments, all of the above test equipment and the operator 100 are in the controlled environment 108, and the operator 100 stands on the test flooring 107 and uses the test equipment to perform the test procedures. FIG. 1 also shows the system 1000 and the system 2000. In some cases, system 1000 and system 2000 may be subsystems in the system of FIG. 1. In system 1000, the payment terminal 110 is connected to the current transducer 101 and oscilloscope 102. In some embodiments, the current transducer 101 is connected to the outer shell of the low voltage power plug of the payment terminal. In system 2000, the capacitance measure fixture 105 is connected to the capacitance meter 104. The systems, test equipment, their functions, and the test procedure are described in detail below.

Although one operator 100 is shown in FIG. 1, any suitable number of people may collaborate during the test procedures.

The following test equipment may be used in the embodiments of the invention:

Current Transducer 101: A device to detect the discharge pulse that occurs when the payment device 109 is discharged into the payment terminal 109.

Oscilloscope 102: An oscilloscope or another measuring device that is capable of measuring fast rise time pulses.

Charging Source 103: A high voltage, low current power supply may be required to charge both the payment device 109 and the operator 100 performing the test, up to ±10 kV. The charging source is used to charge a payment device (e.g., a payment card) to a pre-specified voltage.

Capacitance Meter 104: A meter capable of measuring capacitance between 0.1 pF to 2 pF with 0.1 pF resolution using a test frequency of 1 kHz and an output voltage of 2.5 VAC, pk-pk.

Figure 2:
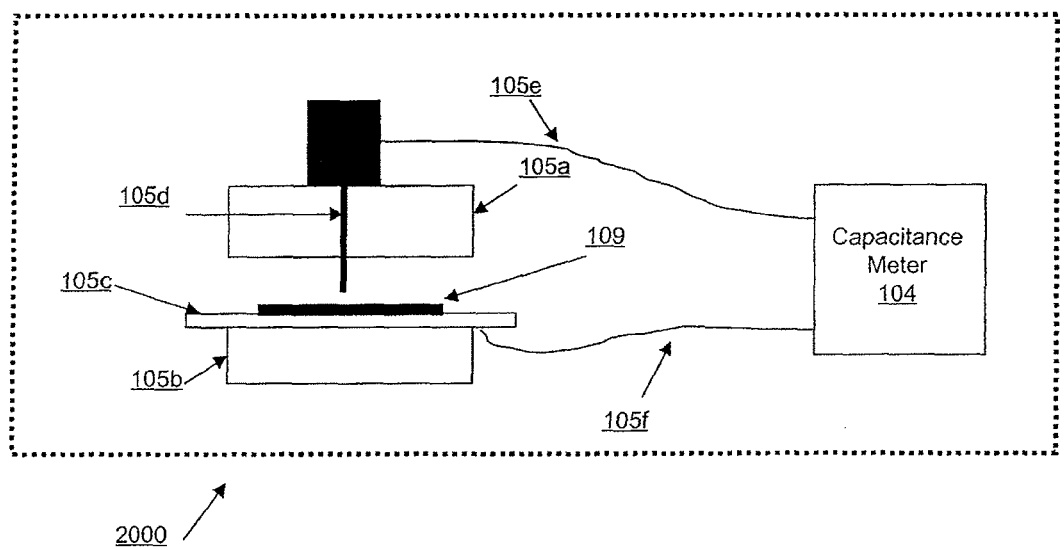
FIG. 2 shows a system, according to an embodiment of the invention.

Capacitance Measure Fixture 105: A device having a 5-lb (2.2 kg) probe as shown in FIG. 2. FIG. 2 shows system 2000 that is the capacitance measure fixture connected to the capacitance meter 104. FIG. 2 shows the side view of the capacitance measure fixture 105. The capacitance measure fixture 105 has a top part 105a, a bottom part 105b, ground plane 105c, probe 105d (that in some embodiments may be a spring-loaded gold plated pointed electrode), and wires 105e and 105f. The payment device 109 is placed on the ground plane 105c such that the elements in the payment device that their capacitances are measured are in face up position. The ground plane 105c is then placed on the bottom part 105b. Wire 105e is connected to the probe at one end and to the capacitance meter 104 at the other end. The wire 105f is connected to the ground plane at one end and to the capacitance meter 104 at the other end. During the measurement, the probe 105d penetrates any insulated outer coating of the payment device to access the metal layer, if any, of the components of the payment device 109. The capacitance is then measured between that component and the ground plane.

Charge Plate Monitor 106: An instrument capable of measuring the voltage on a person performing a pre-defined activity such as walking. It should be capable of measuring up to ±10 kV.

Test flooring 107: A tile floor and nylon carpet approximately 1 m$^2$ (3×3 ft). The floor should not have been treated with any type of static control such as fibers, coatings, etc. They must be capable of generating at least +2 kV and −2 kV respectively when a person wearing sneakers takes a minimum of 3 steps.

Controlled Environment 108: An enclosed area that is capable of maintaining a relative humidity of 12±3% RH and temperature of 23±3° C. (73±3° F.). It should be sufficiently large to allow a person (operator) to perform the required tests. These test conditions are those specified for low humidity ESD testing of military and commercial electronic devices. Other humidity and temperature conditions may also be used.

Payment device 109, also referred to as a portable consumer device or reference card, refers to any suitable device that allows a payment transaction to be conducted with a payment terminal. Payment device 109 may be in any suitable form. For example, suitable payment device 109 can be hand-held and compact so that they can fit into a consumer's wallet and/or pocket (e.g., pocket-sized). They may include smart cards, magnetic stripe cards, keychain devices (such as the Speedpass™ commercially available from Exxon-Mobil Corp.), etc. In some cases, payment device 109 may be associated with an account of a user (card holder) such as a bank account.

Payment terminal 110, also referred to as the Point of Sale device (POS) or access device, may be any suitable device for communicating with a merchant and for interacting with payment device 109. Payment terminal 110 can be in any suitable location such as at the same location as the merchant. Payment terminal 110 may be in any suitable form. Some examples of payment terminals 110 include POS devices, cellular phones, PDAs, personal computers (PCs), tablet PCs, hand-held specialized readers, set-top boxes, electronic cash registers (ECRs), automated teller machines (ATMs), kiosks, security systems, access systems, and the like. Payment terminal 110 may use any suitable contact or contactless mode of operation to send or receive data from payment card 110.

The payment terminal 110 receives the account data from the payment device 109 and generates an authorization request message.

Figure 3:
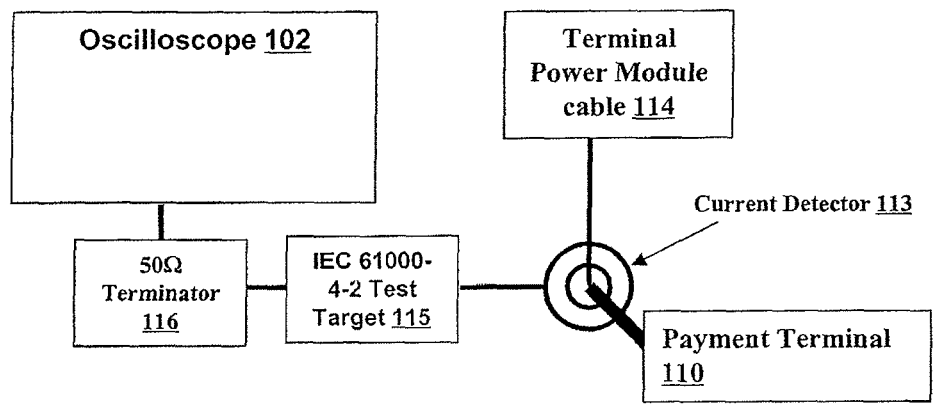
FIG. 3 shows the process of connecting an oscilloscope to a payment terminal according to an embodiment of the invention.

FIG. 3 shows an exemplary process of connecting the payment terminal 110 to the oscilloscope 102 according to an embodiment of the invention. As shown in FIG. 3, a low voltage connector from the payment terminal power module cable 114 is passed through a ¼" ID lug of the current detector 113 and then plugged into the 5 mm power input jack of the payment terminal 110. It will be understood by those skilled in the art that other types of power connections may need a special adapter design. At this point, the lead from the current detector 113 is plugged into IEC 61000-4-2 Test Target 115 which detects the discharge pulse that is present on the outer shell of the power plug when a charged payment device is inserted or swiped in the payment terminal 110. IEC 61000-4-2 Test Target 115 converts the discharge pulse signal to a current pulse. The IEC 61000-4-2 Test Target 115 has a 50 Ohm output impedance. Therefore, the 50 Ohm terminator 116 is used to match the 50 Ohm output impedance of the IEC 61000-4-2 Test Target 115 to the 1 megOhm input impedance of the oscilloscope 102 or other measuring device. The oscilloscope 102 or another measuring device detects the current pulse and displays and records the waveform. In some embodiments, the oscilloscope 102 settings are typically a time base of 10-50 nsec/div and 5-100 mA/div for payment devices not charged and 50-5000 mA/div for payment devices that have been charged. Also, in some embodiments, trigger levels are typically set at 1 division of the vertical sensitivity selected. For example, at 50 mV/div, trigger level is set at 50 mV. It will be understood by those skilled in the art that other settings may apply. In another embodiment, the read head of the payment terminal may be connected to a current transducer via a short wire (approximately 6 inches [152 mm]) and the current transducer is then connected to an oscilloscope or other measuring device.

II. Methods

The methods of measuring the peak discharge current (Ip) resulting from a simulated electrostatic discharge and calculating the energy of the discharge current are described with reference to the figures.

Figure 4:
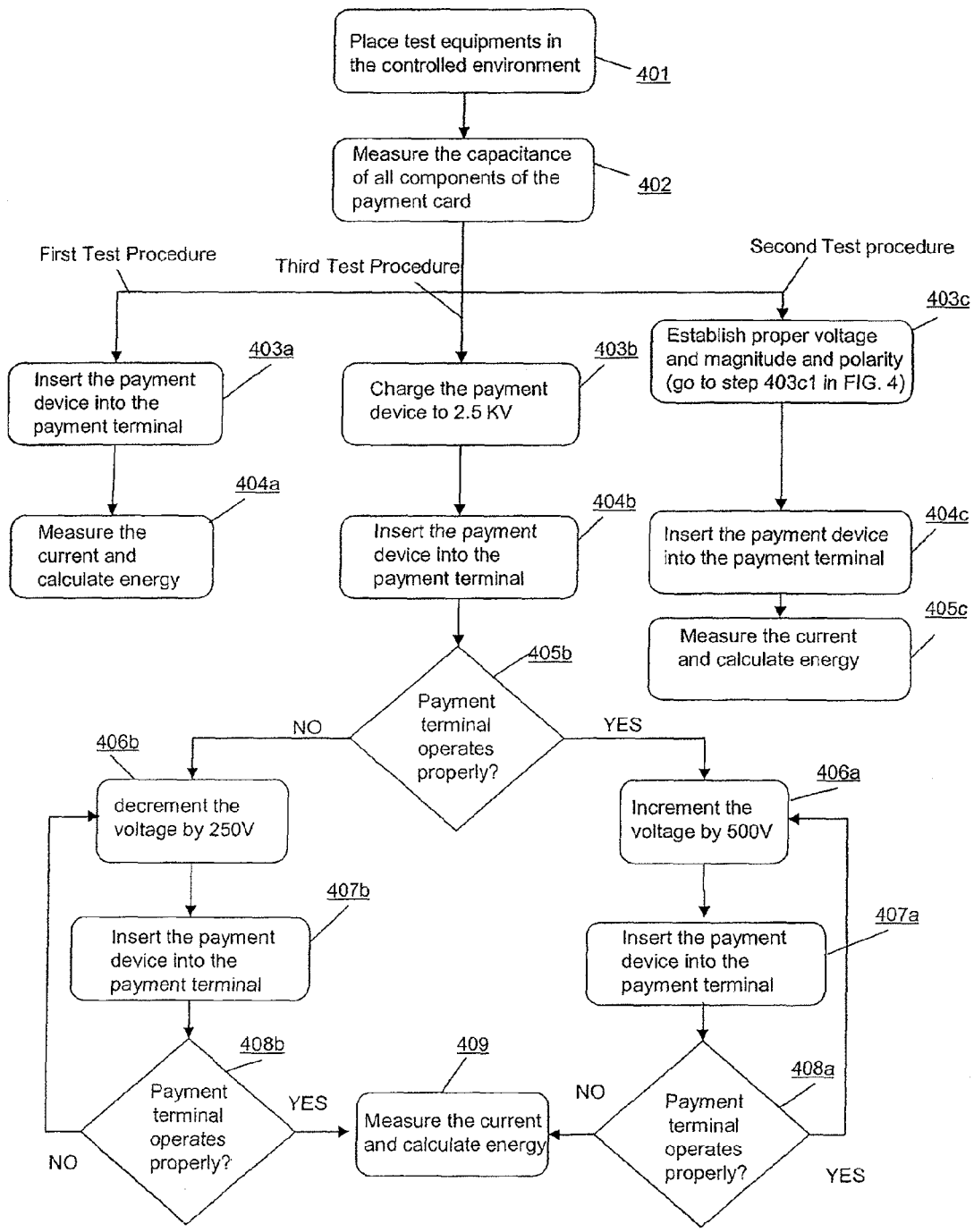
FIG. 4 shows a flowchart that illustrates three different test procedures, according to an embodiment of the invention.

FIG. 4 is a flowchart that illustrates the steps involved in performing test preparation steps and three test procedures for defining ESD susceptibility of payment terminals.

A. Test Preparation

In some embodiments, the payment device 109 and the payment terminal 110 are conditioned in the controlled environment 108 for a minimum of 48 hours prior to test. (This is shown as step 401 in FIG. 4). In step 402 the capacitance of all components of the payment device 109 is measured. The capacitance of the payment device is a measure of the amount of charge that can be stored in a given component on the payment device 109. It has been found that a capacitance greater that 6 pF when charged to 5 kV contains sufficient energy to disrupt a payment terminal known to be ESD sensitive. Capacitance of the contact/contactless component of a payment device 109, typically range from 20-50 pF due to the associated electronics imbedded within the payment card 109.

In some embodiments, the capacitance is measured using the system 2000 shown in FIG. 2. The payment device 109 is placed on the ground plane 105c of the capacitance measure fixture 105 such that the elements in the payment device 109 whose capacitances are going to be measured are accessible by the probe 105d. The ground plane 105c is then placed on the bottom part 105b. The capacitance meter 104 should first be set to zero. The pointed electrode is placed on an unobstructed portion of the payment device 109 and then the ZERO control of the capacitance meter 104 is adjusted until the meter reads "0.0". The payment device 109 is moved so that the pointed electrode of the probe 105d is over the component to be measured. The point of the probe 105d penetrates any insulated outer coating to access the metal layer, if any, of a component of the payment device 109. The capacitance is then measured between that component and the ground plane 105c. The above procedure is repeated using several locations around the respective component on the payment device 109. Also, the capacitance of the magnetic stripe and any marks on the payment device 109 are measured. It may also be beneficial to cut away any heavy outer insulated layer if a known conductive component is buried below so the pointed electrode can make physical contact.

In some embodiments, the capacitance of the card may be measured by the capacitance meter 104 and without the use of the capacitance measure fixture 105. However, it is appreciated that the capacitance measure fixture may advantageously be used for better accessibility of the probe 105d some of the components of to the payment device 109.

B. Test Procedures

When the capacitance of the reference card 109 is measured, the first, second and third test procedures shown in FIG. 4 may be performed in any order and in any suitable combination, with any other suitable test procedures.

First Test Procedure

In the first test procedure, the peak discharge current (Ip) (first current level) is measured, and energy of the discharge (first energy level) is calculated when the payment device 109 is inserted into the payment terminal 110 with minimal operator activity. Prior to insertion, the operator should touch ground first to remove any residual charge. The goal of this test is to measure a discharge current during a normal operation for comparison purposes. Normal insertion of the payment device 109 into the payment terminal 110, typically generates a peak discharge current that can range from just a few milliamps (mA) to over 250 mA.

In step 403a, operator (user) 100 inserts the payment device 109 into the payment terminal 110 that is part of the system 1000. In this test procedure, the operator 100 should not move or take any action before the payment device 109 is inserted into the payment terminal 110. In step 404a, the operator 100 uses the current transducer 101 and oscilloscope 102 to measure the peak discharge current (Ip). The measurements performed by the oscilloscope 102 may then be supplied to an energy calculation program running on the computer system 111 to calculate the energy of the discharge. In some embodiments, the CSV data or other data format from the oscilloscope 102 or another measuring device in system 1000 are provided to an energy calculation program as a CSV data file. The CSV (Comma Separated Values) file is a specially formatted plain text file that stores measured values from the oscilloscope 102 or another measuring device. In one embodiment, the computer system 111 may be coupled to the oscilloscope 102 or another measuring device in system 1000 and the CSV file may be directly supplied to the energy calculation program from the oscilloscope 102 or another measuring device when the payment device 109 is inserted into the payment terminal 110.

In one embodiment, the energy calculation program uses the following formula to calculate the energy of the peak discharge current (Ip), where the resulting energy is expressed in nanoJoules (nJ) or microJoules (pJ).

Where:

$$\text{Energy} = R \times t \times \sum_{i=1}^{n} I_i^2$$

R=value of the circuit resistance
t=time between samples
I=current from probe (voltage/5 for CT-1)
n=total number of samples
(Note: I=Voltage/1 for test target)

In some embodiments, in addition to the measurement of the current level and calculation of the energy, the payment terminal is monitored for failure symptoms and proper operation. Failure symptoms may be the malfunction of the lights on the payment terminal or the screen of the payment terminal. Proper operation is defined as the ability of the payment terminal to conduct a payment transaction. In some cases, a payment terminal may demonstrate failure symptoms, but still be able to properly generate and transmit an authorization request message. In this test procedure, it is unlikely that the normal insertion of the payment device into the payment terminal results in either failure symptoms or improper operation. However, if it occurs, the test can be repeated.

Second Test Procedure

In the second test procedure, the peak discharge current (Ip) is measured when the operator 100, wears a particular type of footwear (e.g., sneakers) and performs a certain predefined physical activity (e.g., operator 100 walks across a test floor). The goal of this test is to simulate a build up of charge on the payment device through certain user activity such as walking up to a payment terminal 110 while holding the payment card 109.

Figure 5:
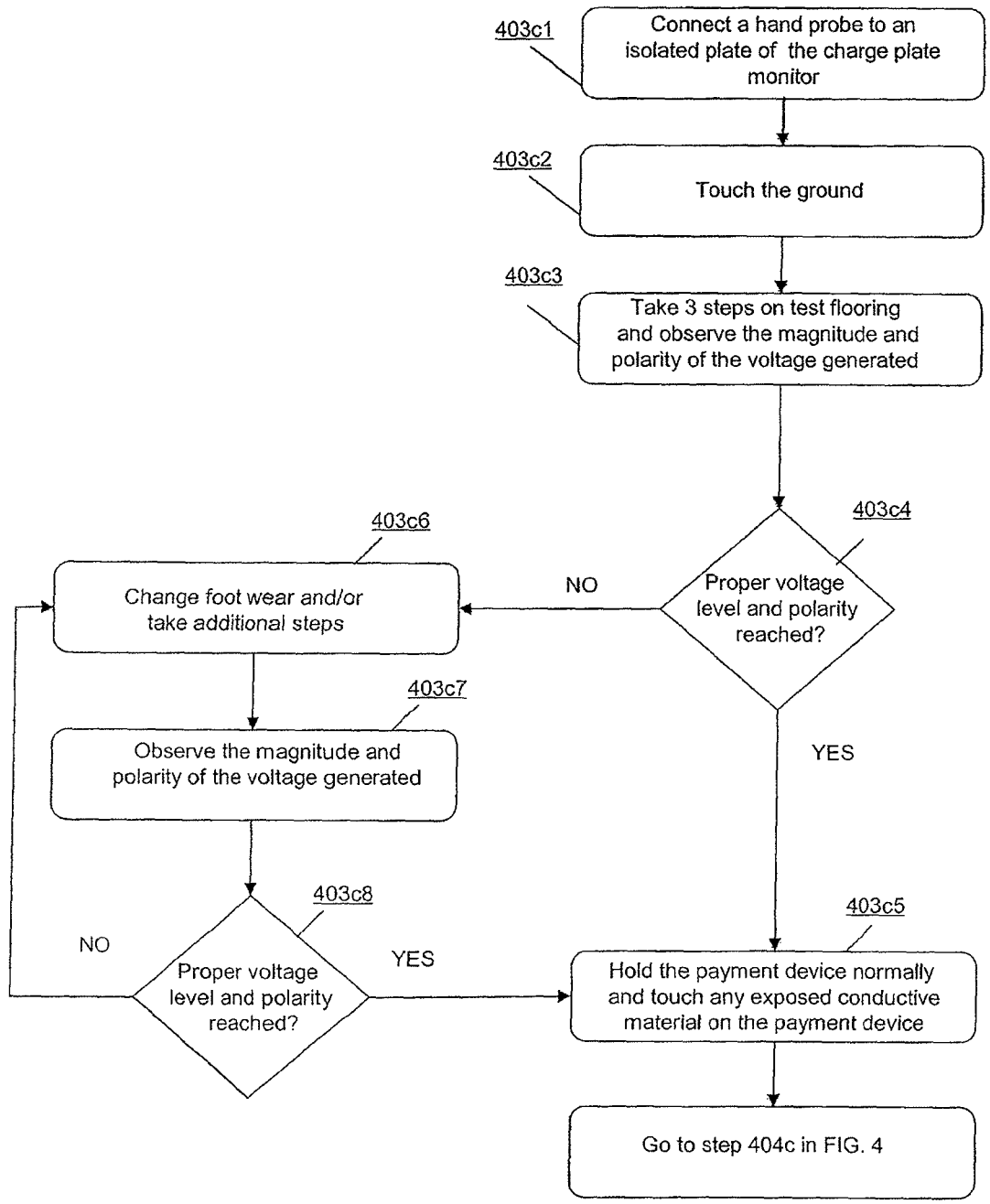
FIG. 5 shows a flowchart that illustrates the steps involved in preparation of a test procedure, according to an embodiment of the invention.

In this test procedure, it can be determined that the operator activity (i.e. walking on test flooring 107) produces an appropriate voltage level (magnitude) and polarity (step 403c). A flowchart in FIG. 5 illustartes the steps required to establish the proper magnitude and polarity of the voltage needed to perform the test. The flowchart shown in FIG. 5 is an expansion on step 403c in FIG. 4.

In step 403c1, the operator holds a hand probe 100 that is connected to an isolated plate of the charge plate monitor 106. In step 403c2 the operator 100 touches the ground. In step 403c3, the operator 100 takes three steps on the test flooring 107 and observes the magnitude and polarity of the voltage generated using the charge plate monitor 106. The test flooring 107 can be comprised of two kinds of materials that can be tile flooring and nylon carpet. Walking on the tile flooring typically generates a positive voltage and walking on the'nylon carpet typically generates a negative voltage. Other types of flooring can be used in other embodiments of the invention. The operator 100 then performs the steps shown in the flowchart of FIG. 6 using both the title flooring and the nylon carpet, one at a time. For example, the operator 100 may first perform the test procedure by walking on a title flooring and then repeat the test procedure by walking on the carpet flooring, or vice versa.

If the proper voltage level and polarity are generated (step 403c4), the operator 100 holds the payment device 109 normally and any exposed conductive component of the payment device is touched 109 (e.g, metallic logo, security chip, etc.) (step 403c5). The magnitude of the voltage generated by the activities of the operator 100 should be about 2-3 kV and the polarity of the voltage depends on the type of the test flooring 107 and/or footwear (i.e. tile flooring=positive voltage and nylon carpet=negative voltage).

If the proper voltage is not reached, the operator 100 changes the footwear or takes additional steps on the test flooring 107 (step 403c6). The operator 100 may also change his footwear and take additional steps with the new footwear to reach the desired voltage level. The operator 100 then observes the magnitude and polarity of the voltage (step 403c7). If the proper voltage level and polarity are observed (step 403c8), the operator 100 holds the payment device 109 normally and touches any exposed conductive component (e.g., metallic logo, security chip, etc.) of the payment device 109 (step 403c5).

Walking on the test flooring while touching a conductive part of the payment device 109 results in a worst case scenario in the build up of charge on the payment device 109. The steps performed in the flowchart of FIG. 5, determines if walking on the test flooring 106 produces the desired level of charge that can be transferred to the payment device 109 via the operator 100.

Referring to the flowchart of FIG. 4, in step 405c the operator 100 inserts the payment device 109 into the payment terminal 110. In step 406c, the peak discharge current (Ip) (second current level) is measured by using the system 1000 and the energy of the discharge current (second energy level) is calculated by the energy calculation program discussed in the first test procedure. In some embodiments, this test is repeated at least three to six times and the payment terminal 110 is checked for proper operation after each test.

In some embodiments, in this test procedure, the peak discharge current is measured and the energy of the discharge is calculated regardless of whether that current level results in failure symptoms or improper operation of the payment terminal.

Other operator activities can also be performed such as rubbing the payment device against another payment device and rubbing the cards against other materials such as cotton, nylon wool and leathe Third Test Procedure In the third test procedure, the minimum charge on a payment device that causes a payment terminal disruption and subsequent disruption of a payment transaction when the payment device contacts the read head of the payment terminal is determined.

As shown in the flowchart of FIG. 4, in step 403b, the payment device 109 is charged to +2.5 kV via the charging source 103. To charge the payment device 109, the operator 100 stands on an insulated surface to prevent any charge from bleeding off to ground. The operator 100 holds the payment device 109 normally, sets the charging source 103 to +2.5 kV, touches the conductive components of the payment device such as the contact/contactless pad of the payment device 109 to the output of the charging source 103, and then immediately inserts the payment card 109 into the slot of the payment terminal 110 (step 404b). The operator can also charge the payment device inductively by holding the payment device in a normal fashion and touching the charging device. Any charge built-up on the operator will be induced onto the card components. The operator 100 then observes the payment terminal 110 for proper operation (step 405b). In some embodiments, the payment terminal 110 is checked for proper operation by determining whether the payment terminal 110 is capable of generating and transmitting an authorization request message.

In some embodiments, and as an optional step, the operator 100 after performing step 404b, records the peak discharge current (Ip) and CSV data, which are measured by the current transducer 101 and oscilloscope 102 or another measuring device, respectively, in the system 1000. The operator 100 may measure the peak discharge current (Ip) and repeat steps 403b and 404b three to six times to make sure that the measurements are consistent. If the payment terminal 110 operates properly and without any disruption, the operator 100 increases the voltage in 500V increments (step 406a), and inserts the payment device 109 into the payment terminal 110 (step 407a). The operator 100 then checks the payment terminal 110 for proper operation (step 408a). The operator 100 repeats steps 406a, 407a, and 408a until a terminal disruption (failure symptoms or improper operation) occurs. The operator 100 then measures the peak discharge current (Ip) (third current level) and calculates the energy (using the energy calculation program) of the discharge (third energy level) that caused the disruption (step 409). This measurement is done similar to the measurement discussed in the first test procedure (step 404a).

Referring to step 405b, if the payment terminal 110 fails, the operator 100 decreases the voltage by 250V (step 406b), and inserts the payment device 109 into the payment terminal 110 (step 407b). The operator 100 then checks the payment terminal 110 for proper operation (step 408b). The operator 100 repeats the steps 406b, 407b, and 408b until the payment terminal 110 operates without any disruption when the payment device is inserted at least three times. In step 409, the operator 100 then measures the peak discharge current (Ip) using the system 1000 and calculates the energy of the discharge by using the energy calculation program described in the first test procedure.

In some embodiments, the operator 100 then repeats the third test procedure starting with −2.5 kV in step 403b.

In some embodiments, a current level that is equal to or greater than the highest measured current levels in the test procedure is determined as a reference current level. This reference current level may be used during the design process of a payment terminal to make sure that the payment terminal has a high chance of withstanding a majority of the ESD events.

Performing the above-described tests may result in values shown in FIGS. 6, 7, and 8. The test results shown in FIGS. 6, 7, and 8 may be obtained as a result of testing five types of payment terminals and five types of reference cards. It will be understood by those skilled in the art that the values shown in FIGS. 6, 7, and 8 are experimental results that could be obtained by performing the above-described tests and are for illustration purposes only.

In these experimental tests, five different payment device configurations with multiple designs including dual interface, contact only, and foil cards and four payment terminals are utilized. FIG. 6 shows the measured discharged currents after performing the first and the second test procedures. The table of FIG. 6 illustrate that different types of payment devices result in varying levels of ESD contribution when used with different types of payment terminals. Also, the table of FIG. 6 illustrates that insertion of the payment device in the payment terminals results in higher levels of ESD in the second test procedure as compared to the first test procedure. FIG. 7 also illustrates the experimental calculated energy levels for each of the measured currents in the table of FIG. 6.

FIG. 8 illustrates the experimental measured discharge currents and energy levels after performing the third test procedure. The current and the calculated energy levels illustrate the threshold voltages that start to cause a disturbance in the operation of the payment terminals.

By studying the measured values of tests similar to the experimental tests shown in FIGS. 6, 7, and 8, a set of threshold current levels and energy levels for determining the susceptibility of payment terminals to electrostatic discharge (ESD) when a payment card is inserted, may be proposed. For example, it may be suggested that a payment terminal that can withstand discharge currents of about or greater than 2000 mA and discharge energy levels of about or greater than 5000 nJ would most likely survive some of the discharge currents observed in these tests.

In practice, the first, second and third test procedures may be used as illustrated in this example to determine pre-defined reference current and energy levels. For example, in the above sample test, the pre-defined reference current level may be 2000 mA and the pre-defined energy level may be 5000 nJ. The pre-defined reference current and energy levels are then compared to one or more measured current and calculated energy levels resulting from a the test to determine whether a payment terminal is likely to withstand ESD of certain levels.

It can be appreciated that the embodiments of the invention provide many advantages. For example, these tests and values may be used as guidelines for the industry and standards organizations i.e. ISO/IEC and EMV.

Figure 9:
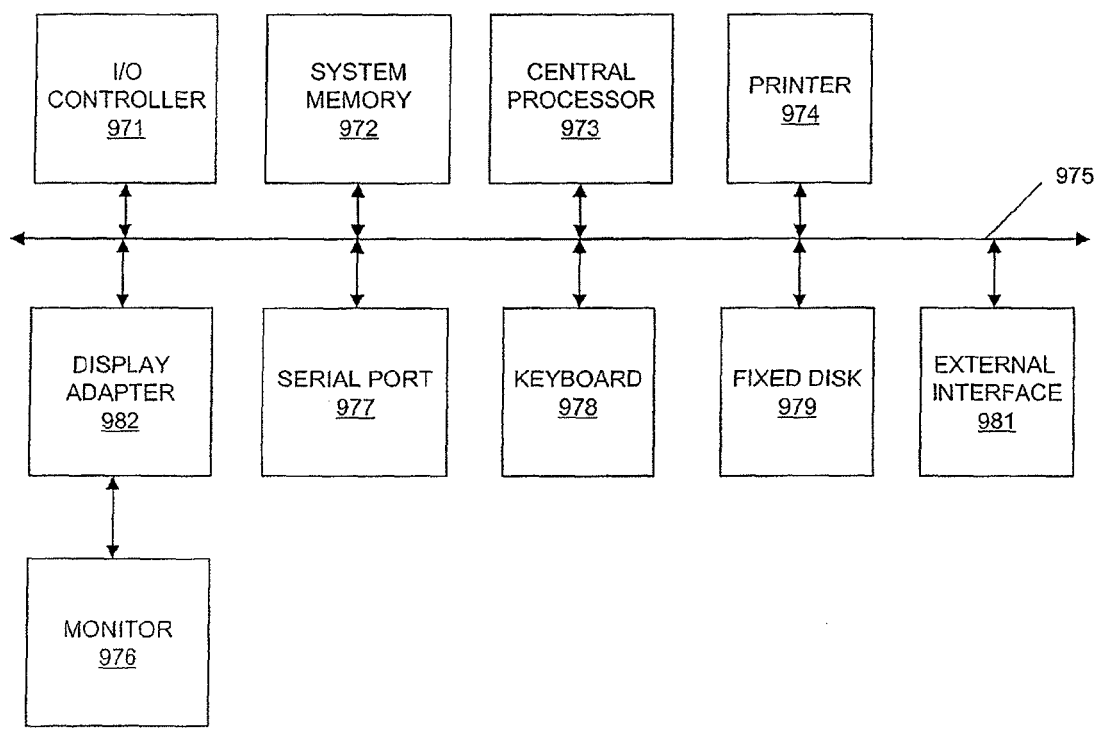
FIG. 9 shows a system, according to an embodiment of the invention.

The various participants and elements used to perform the above test procedure may operate one or more components in one or more computer apparatuses (e.g., computer system 111) to facilitate the functions described herein. Further, the testing data in FIGS. 6-8 can also be included in a computer apparatus, and such testing data can be used in automatic tests of payment terminals in a production environment. Any of the participants and elements may use any suitable number of subsystems to facilitate the functions described herein. Examples of such subsystems or components are shown in FIG. 9. The subsystems shown in FIG. 9 are interconnected via a system bus 975. Additional subsystems such as a printer 974, keyboard 978, fixed disk 979 (or other memory comprising computer readable media), monitor 976, which is coupled to a display adapter 982, and others are shown. Peripherals and input/output (I/O) devices, which couple to a I/O controller 971, can be connected to the computer system by any number of means known in the art, such as serial port 977. For example, serial port 977 or external interface 981 can be used to connect the computer apparatus to a wide area network such as the Internet, a mouse input device, or a scanner. The interconnection via system bus allows the central processor 973 to communicate with each subsystem and to control the execution of instructions from system memory 972 or the fixed disk 979, as well as the exchange of information between subsystems. The system memory 972 and/or the fixed disk 979 may embody a computer readable medium.

The software components or functions described in this application may be implemented as software code to be executed by one or more processors using any suitable computer language such as, for example, Java, C++ or Perl using, for example, conventional or object-oriented techniques. The software code may be stored as a series of instructions, or commands on a computer-readable medium, such as a random access memory (RAM), a read-only memory (ROM), a magnetic medium such as a hard-drive or a floppy disk, or an optical medium such as a CD-ROM. Any such computer-readable medium may also reside on or within a single computational apparatus, and may be present on or within different computational apparatuses within a system or network.

Some embodiments of the present invention can be implemented in the form of control logic in software or hardware or a combination of both. The control logic may be stored in an information storage medium as a plurality of instructions adapted to direct an information processing device to perform a set of steps disclosed in embodiments of the present invention. Based on the disclosure and teachings provided herein, a person of ordinary skill in the art will appreciate other ways and/or methods to implement the present invention.

In embodiments, some of the entities described herein may be embodied by a computer that performs any or all of the functions and steps disclosed.

Any recitation of "a", "an" or "the" is intended to mean "one or more" unless specifically indicated to the contrary.

The above description is illustrative and is not restrictive. Many variations of the invention will become apparent to those skilled in the art upon review of the disclosure. The scope of the invention should, therefore, be determined not with reference to the above description, but instead should be determined with reference to the pending claims along with their full scope or equivalents.

What is claimed is:

1. A method comprising:
measuring a capacitance of a payment device using a capacitance measure fixture and a capacitance meter;
measuring a first current level after performing a first test procedure, using a measuring device, wherein the first test procedure comprises inserting the payment device into a payment terminal;
measuring a second current level after performing a second test procedure, using the measuring device; and
measuring a third current level after performing a third test procedure, using the measuring device, wherein the third test procedure comprises:
charging the payment device to a first predetermined voltage, using a charging source;
inserting the payment device into the payment terminal;
observing the payment terminal for proper operation; and
decrementing an output of the charging source by a first predetermined voltage increment, upon determining that the payment terminal does not operate properly;
repeating the charging, inserting, observing, and decrementing steps until the payment terminal starts functioning properly, wherein a current level before a voltage level that results in proper function of the device is recorded.

2. The method of claim 1, further comprising:
determining a reference current level that is equal to or greater than highest of the first current level, the second current level and the third current level.

3. The method of claim 1, further comprising:
comparing the first current level, the second current level and the third current level with a pre-defined reference current level.

4. The method of claim 3, wherein the pre-defined reference current level is 2000 mA.

5. The method of claim 1, wherein the second test procedure comprises:
performing a pre-defined physical activity to charge the payment device with electrostatic charge; and
inserting the payment device into the payment terminal.

6. The method of claim 5, wherein the pre-defined physical activity comprises walking up to a terminal and rubbing the payment device against another object.

7. The method of claim 1, wherein the third test procedure comprises:
charging the payment device to a second predetermined voltage, using a charging source;
inserting the payment device into the payment terminal;
observing the payment terminal for proper operation;
incrementing an output of the charging source by a second predetermined voltage increment, upon determining that the payment terminal continues to operate properly; and repeating the charging, inserting, observing, and incrementing steps until the payment terminal stops functioning properly, wherein a current level that causes the payment terminal to malfunction is recorded.

8. The method of claim 7, wherein the second predetermined voltage is 2.5 kV.

9. The method of claim 7, wherein the second predetermined voltage increment is 500 v.

10. The method of claim 1, further comprising:
calculating a first energy level after performing the first test procedure, using an energy calculation program;
calculating a second energy level after performing the second test procedure, using the energy calculation program running on the computer system;
calculating a third energy level after performing the third test procedure, using the energy calculation program running on the computer system; and
determining a reference energy level that is equal to or greater than highest of the first energy level, the second energy level and the third energy level.

11. The method of claim 10, wherein the first energy level, the second energy level and the third energy level are calculated from the first current level, the second current level and the third current level respectively using the energy calculation program.

12. The method of claim 10, further comprising:
comparing the first energy level, the second energy level and the third energy level with a pre-defined energy level.

13. The method of claim 12, wherein the pre-defined energy level is 5000 nJ.

14. The method of claim 1, further comprising:
placing the payment device, the payment terminal and a plurality of test equipment in a controlled environment before measuring the capacitance of at least one component of the payment device.

15. The method of claim 14, wherein the payment terminal and the plurality of the test equipment is placed in the controlled environment for at least 48 hours.

16. The method of claim 1, wherein the first current level, the second current level, and the third current level are the result of electrostatic discharge of the payment device when inserted into the payment terminal.

17. The method of claim 1, wherein the payment device is a payment card.

18. The method of claim 1, wherein the capacitance of at least one of the components of the payment device is measured.

19. The method of claim 1, wherein the capacitance of each component of the payment device must be at least 5 pF.

20. The method of claim 1, where in the capacitance of a magnetic stripe of the payment device must be less than or equal to 2 pF.

21. The method of claim 1, wherein the measuring device is an oscilloscope.

22. The method of claim 1, wherein the first predetermined voltage is 2.5 kV.

23. The method of claim 1, wherein the first predetermined voltage increment is 250 v.

24. The method of claim 1, wherein the capacitance measure fixture comprises:
a probe;
a top assembly configured to secure the probe;
a bottom assembly configured to hold a payment device;
a first wire coupled to the top assembly; and
a second wire coupled to the bottom assembly, wherein the first wire and the second wire are coupled to the capacitance meter.

25. The method of claim 24, wherein the probe is configured to penetrate an insulating layer of the payment device to access a metal layer.

26. The method of claim 25, wherein when the probe accesses a metal layer, an electrical connection is established between the probe and the capacitance meter and the capacitance of the metal layer is measured.

27. The method of claim 24, wherein the probe weighs about 5 lb.

28. A system comprising:
a payment terminal configured to receive account data from a payment device and generate an authorization request message;
an oscilloscope coupled to the payment terminal and configured to generate a data file when the payment device is in the payment terminal;
a current transducer coupled to the payment terminal and configured to measure a current when the payment device is in the payment terminal;
a charging source adapted to charge each of the payment device and an operator to a pre-specified voltage; and
a computer system coupled to the oscilloscope and configured to receive data from the oscilloscope and calculate a first energy level, a second energy level and a third energy level using an energy calculation program stored on and executed by the computer system.

29. The system of claim 28, wherein the payment device is a payment card.

30. The system of claim 28, wherein the system is configured to:
measure a first current level after performing a first test procedure, using the oscilloscope;
measure a second current level after performing a second test procedure, using the oscilloscope; and
measure a third current level after performing a third test procedure, using the oscilloscope.

31. The system of claim 30, wherein the first energy level, the second energy level and the third energy level are calculated from the first current level, the second current level and the third current level, respectively.

32. The system of claim 28, wherein the data is in a CSV data file.

* * * * *